United States Patent [19]
Lee

[11] Patent Number: 5,646,052
[45] Date of Patent: Jul. 8, 1997

[54] ISOLATION REGION STRUCTURE OF SEMICONDUCTOR DEVICE AND METHOD FOR MAKING

[75] Inventor: Chang Jae Lee, Chungcheongbuk-do, Rep. of Korea

[73] Assignee: Goldstar Electron Co., Ltd., Rep. of Korea

[21] Appl. No.: 633,002

[22] Filed: Apr. 16, 1996

Related U.S. Application Data

[63] Continuation of Ser. No. 296,175, Aug. 29, 1994, abandoned.

[30] Foreign Application Priority Data

Jun. 16, 1994 [JP] Japan ................. 6-13625

[51] Int. Cl.$^6$ ................. H01L 21/76
[52] U.S. Cl. ................. 437/67; 437/69; 437/72; 257/397; 257/510; 257/513
[58] Field of Search ................. 257/510, 513; 437/61, 67, 68, 69, 72, 73

[56] References Cited

U.S. PATENT DOCUMENTS

| | | | |
|---|---|---|---|
| 4,546,538 | 10/1985 | Suzuki | 257/510 |
| 4,561,172 | 12/1985 | Slawinski et al. | 437/67 |
| 4,636,281 | 1/1987 | Buiguez et al. | 437/67 |
| 4,660,068 | 4/1987 | Sakuma et al. | 257/513 |
| 4,868,136 | 9/1989 | Ravaglia | 437/67 |
| 4,892,614 | 1/1990 | Chapman et al. | 437/67 |

*Primary Examiner*—Mahshid D. Saadat
*Assistant Examiner*—S. V. Clark

[57] ABSTRACT

A method of forming a semiconductor device by concurrently forming both single-trenched small field regions and double-trench-extension large field regions, and the device so formed. The method includes: forming an insulating layer on a substrate; forming a mask layer on the insulating layer to cover only active regions such that small field regions and large field regions are left uncovered by the mask layer; increasing a thickness of the insulating layer in each field region in proportion to the width of that field region; removing all of the insulating layer in the small field regions while removing only some of the insulating layer in the large field regions so that, in width cross-section, the large field regions have an exposed substrate narrow edge-area that borders both sides of a remaining portion of the insulating layer; forming trenches in the substrate corresponding in location to the exposed substrate areas such that an intermediate-width trench is created in each small field region and such that a wide trench, having two trench-deepening extensions, is created in each large field region; putting conductive material into the trenches such that the trench-deepening extensions are filled completely and the intermediate-width trenches are at least partially filled; and converting a portion of the conductive material into an insulating cap.

22 Claims, 19 Drawing Sheets

ISOLATION REGION STRUCTURE OF SEMICONDUCTOR DEVICE AND METHOD FOR MAKING

This application is a continuation of application Ser. No. 08/296,175 filed on Aug. 29, 1994, now abandoned.

FIELD OF THE INVENTION

The invention relates to a semiconductor device useful for high integration. In particular, the invention pertains to isolation region structures of a semiconductor device which are remarkably reduced in lateral encroachment on the active region and are superior in punch-through characteristics. Also, the invention pertains to methods for making isolation region structures which employ a combination of trench-type, type, buried oxide (hereinafter referred to as "BOX") process steps and local oxidation of silicon (LOCOS) process steps which are simple and capable of consistently producing the isolation region structures regardless of the distance between active regions.

With regard to a general metal oxide semiconductor (hereinafter referred to as "MOS") device, an isolation technique for minimizing a field region (that is, the inactive region to isolate unit devices from one another) is one of the most important techniques for the high integration of semiconductor devices.

In 1970, E. Kooi and J. A. Appels derived an isolation technique known as "LOCOS" from p-n junction isolation techniques which have been applied to bipolar devices. By virtue of the LOCOS technique, the degree of integration in MOS devices and bipolar devices could be remarkably increased.

As one aspect of the rapid development of DRAMs, novel methods are incessantly required for higher degrees of integration of these devices. Among such methods, methods for making improved isolation region structures have especially held the key to the achievement of highly integrated semiconductor devices.

In LSI and VLSI integrated circuits using MOS technology, the LOCOS isolation process has been utilized to isolate one active region from another.

In order to better understand the field of the invention, conventional methods for making an isolation region structure will be described.

BACKGROUND OF THE INVENTION

Referring to FIGS. 1A and 1B, there is illustrated a prior art method for forming an isolation layer of a semiconductor device based on a general LOCOS process. As shown in FIG. 1A, a thin oxide layer 11 is positioned between a substrate 10 (formed, for example, of silicon) and a nitride layer 13 (which serves as an oxidation mask) in order to relieve stress due to a difference in thermal properties between the substrate 10 and the nitride layer 13.

Subsequently, a LOCOS process (as shown in FIG. 1B) is applied to the substrate, so as to form a field oxide layer 19 on the semiconductor device. However, when forming the field oxide layer 19 with the LOCOS technique, the field oxide layer 19 grows not only vertically, but also laterally and this growth intrudes somewhat underneath the edges of the nitride layer 13, so that the active region becomes reduced. In addition, the field ions implanted below the field oxide layer 19 diffuse into the active region, which aggravates the reduction of the active region. This lateral encroachment on the active region by the field oxide layer 19 under the nitride layer 13, known as "bird's beak", can grow to a thickness of about half the thickness of the field oxide layer 19.

With the standard LOCOS process, the field oxide layer thickness has to be reduced in order to reduce the length of the bird's beak encroaching upon the active region; otherwise, the operative active region will be inadequate. The reduction in field oxide thickness, however, causes an increase in the capacitance between the substrate and an interconnection line on chip, thus degrading the characteristics of an IC. In other words, the speed of transferring signals decreases. In addition, the threshold voltage ($V_T$) of the parasitic field transistor is dropped. Accordingly, leakage current under the field oxide layer increases rapidly with reduction in field oxide thickness, resulting in poor isolation between adjacent active regions. Consequently, reducing the thickness of the field oxide layer 19 in order to decrease the length of the bird's beak is limited by the need for isolation.

In the last few years, research and development efforts in LOCOS isolation technologies have been directed to reducing the amount of oxide encroachment in the standard LOCOs process by constraining the growth of the bird's beak without reducing the thickness of the field oxide layer 19.

To reduce the bird's beak, a method has been proposed in which a nitride layer is formed on and beside a pad oxide layer in order to seal the pad oxide layer, and then a field oxidation is carried out with the nitride layer serving as an oxidation mask. Another method, known as "polysilicon buffered LOCOS", has been proposed in article entitled "High Reliability and High Performance 0.35 μm Gate-Inverted TFT's for 16 Mbit and SRAM Applications Using Self-Aligned LDD Structures", International Electron Devices Meeting 1992 at p. 100 (published in 1988). This method is illustrated in FIG. 2. As shown in this figure, a polysilicon buffer layer 23 is additionally formed between a nitride layer 13 which serves as an oxidation mask, and a pad oxide layer 25 of $SiO_2$ in order to suppress the bird's beak growth attributed to the lateral oxidation of pad oxide layer 25 interior of the nitride layer 13. With the polysilicon buffered LOCOS, a field oxide layer 19 is formed with the bird's beak suppressed relative to the case of FIG. 1B.

However, the top of the field oxide layer 19 excessively protrudes from the surface of substrate 10. As a result, there arises difficulty in forming a pattern with an appropriate degree of resolution on a photoresist when processes for gate line formation, wiring formation and so on, as well as the subsequent processes of LOCOS, are performed. In addition, since the field oxide layer 19 is not formed deep within the substrate 10, the punch-through and isolation characteristics become inferior because of the shortness of the channel length of the parasitic field transistor.

In addition to the above techniques, several other isolation techniques have been suggested. For example, there is a SILO (sealed interface local oxidation) process and a SWAMI (side wall masked isolation) process. These modifications of the LOCOS process, however, have many a problem to be solved. With regard to the SWAMI process, the problem of bird's beak, (that is, the encroachment of the field oxide layer on the active region) is not generated. However, it too has problems. Most of these are due to the limitation that the silicon substrate cannot be consistently etched at the preferred slope angle in either wet etch or dry etch. In the case of wet etch, depending on the crystallinity of the substrate, the silicon substrate can be etched only at certain angles with an alkaline aqueous solution, such as KOH or NaOE. Thus, there is no way to control the slope. For example, a wafer is etched at an angle of 45° in the <110> direction. In addition, a further problem arises in that K⁺or Na⁺ions contaminate the silicon substrate.

On the other hand, when a dry etch process is applied to the silicon substrate uniform control of the slope is always a problem.

One of the most troublesome problems in the standard LOCOS process is that, although the width and length of the active region is reduced so as to be useful for a highly integrated device, the thickness of the field oxide layer is not reduced. Thus, the new device has the same heat cycle as the old device. Another problem is that channel stop dopants must be implanted into the field region at a high density in order to stabilize the punch-through voltage in the isolation region of a short channel. Thus, the actual width of the active region is limited to that of the prior processes because the implanted channel stop dopants laterally diffuse into the active region.

Consequently, as the degree of integration in a semiconductor device becomes high, the width of the active field is remarkably reduced. For example, the active region in a 64 Mbit DRAM device is only about 0.4 μm wide in the conventional LOCOS process. Further, the amount of lateral encroachment of channel stop dopants on the active region ΔW is considerable, causing a great loss to the width of the active region.

As shown in FIG. 3, if the active region is designed to be L in length and 0.4 μm in width, W, and if ΔW is 0.1 μm, the actual width of the active region is 0.2 μm (0.4−2×ΔW). This is because the channel stop dopants diffuse from both sides of active region to double the encroachment on the active region.

In fact, in case of the standard LOCOS process, it is believed that the formation of a field oxide layer of about 5,000 Angstroms thickness permits ΔW to be about 0.15 to 0.20 μm.

As would be expected, the reduction in width of the active region limits the amount of current between the source and drain of a transistor, thus raising the threshold voltage of transistor. As a result, the performance of a transistor made by the standard LOCOS is inferior.

Without particular difficulties, the LOCOS process has been used to make a semiconductor device with a maximum line width of about 1.0 μm (1 Mbit DRAM scale), but it begins to have great difficulty in developing a semiconductor device with a maximum line width of about 0.8 μm (4 Mbit DRAM scale).

Since 1985, many efforts have been made to overcome the LOCOS process limitations. One effort is being directed to developing a modified LOCOS technique. Another approach to device isolation is a trench isolation process. In this process, a silicon substrate is etched to form a trench which is subsequently filled with an insulating material.

Because of its technical difficulty, the trench isolation process has, thus far, rarely been applied to actual mass production. In contrast, the modified LOCOS isolation technique has played an important role in developing a semiconductor device of the 64 Mbit DRAM scale (having a maximum line width of 0.4 m) and is highly apt to be applied to mass production.

Another combination technology process has been suggested for an isolation process which can provide planar surfaces by the use of only a single photolithographic masking step, with no encroachment on active region. In this combination technology process, when active regions are apart from each other a relatively great distance (i.e. a wide trench), they are separated from each other by using the LOCOS isolation process. On the other hand, when active regions are apart from each other a relatively short distance (i.e. a narrow trench), a BOX isolation process is applied in order to separate the active regions. This combination technology process is reported in U.S. Pat. No. 4,892,614.

Referring to FIGS. 4A through 4H there is stepwise illustrated a method for isolating the active regions of a semiconductor device which employs a combination of the LOCOS and BOX isolation techniques.

As shown in FIG. 4A, on a substrate 10, there is grown a first thermal oxide layer 12 upon which a nitride layer 13 is deposited using a low pressure chemical vapor deposition (hereinafter referred to as "LPCVD") process.

After deposition of the nitride layer 13, a photoresist layer 16 is coated on the nitride layer 13 and patterned, so as to define the placement of active regions. The nitride layer 13 and the first thermal oxide layer 12 are etched according to the photoresist pattern.

Subsequently, the substrate 10 is etched, so as to form a plurality of trenches 20a–20d. Trenches 20a and 20b are relatively narrow. That is to say, an active region at one side of the narrow trench is relatively near to another active region at the other side of the trench. In contrast, trenches 20c and 20d are relatively wide. In other words, two active regions 18 at the opposite sides of the wide trench 20c are a relatively great distance away from each other. In this figure, reference numeral 21 designate corners of the trenches.

Secondly, FIG. 4B shows the semiconductor device after a second thermal oxide layer 22 has been grown on the areas of the substrate 10 which were exposed by forming the trenches. Prior to this, all the photoresist pattern 16 left on the active regions 18 was removed. Compared with the semiconductor device of FIG. 4A, the second thermal oxide layer 22 serves to slightly round off the corners 21 (FIG. 4B) of the trenches in order to relieve the amount of stress at the corners 21.

Thereafter, as shown in FIG. 4C, a second nitride layer 24 is deposited, followed by the deposition of an oxide layer 26 using a chemical vapor deposition (CVD) process. At this time, the thickness of the oxide layer 26 is chosen to be thick enough to fill the narrow trenches 20a and 20b, while not filling the wide trenches 20c and 20d. As a result, small depressions 27a are formed over the narrow trenches 20a and 20b where the oxide layer 26 fills the trenches. In contrast, in the wide trenches 20c and 20d where the oxide layer 26 on opposite sidewalls does not meet, deep depressions 27b are formed and left unfilled.

FIG. 4D shows a cross-section of the semiconductor device after an anisotropic etch has been carried out. In the wide trenches 20c and 20d, all the oxide layer 26, the second nitride layer 24 and the second thermal oxide layer 22 are removed from under the deep depressions 27b by the etch, thereby exposing the silicon substrate through gaps surrounded by sidewall oxide layer 29 (i.e., the remains of layer 26). On the other hand, in narrow trenches 20a and 20b, the second nitride layer 24 is not removed, since the sidewall oxide layer 29 fills up the trenches and thus protects them from the etch.

FIG. 4E illustrates the formation of a field oxide layer 19 while carrying out a field oxidation process. After the remaining sidewall oxide layer 29 is removed, a field oxide layer 19 is formed in the wide trenches 20c,20d but not in the narrow trenches 20a and 20b since the substrate 10 there remains covered with second nitride layer 24. In contrast, the field oxide layer 19 is grown on the exposed substrate 10 of the wide trenches 20c and 20d. As seen in FIG. 4E, in the wide trench thermal field oxide layer 19 grows underneath the edge of the second nitride layer 24, resulting in bird's beak 31. This bird's beak does not grow up to the top edge of the active regions 18, so that there is no reduction in the active regions 18.

Next, the nitride layers 13 and 24 are removed by dipping them in hot phosphoric acid and an oxide layer 32 is deposited by a chemical vapor deposition (CVD) process so thickly as to fill up all the trenches 20a–20d, as illustrated in FIG. 4F. The thickness of the oxide layer 32 is made sufficient to form a near-planar surface at its top surface.

FIG. 4G shows a cross-section of the semiconductor device after the oxide layer 32 has been subjected to etch-back.

Finally, as shown in FIG. 4H, a gas oxide layer 34 is grown over the exposed surfaces of the substrate.

As stated above, the narrow trenches 20a are filled with oxide layer 32, resulting in a BOX process structure. In contrast, the wide trenches 20c and 20d are partially filled with the field oxide layer 19 over which the oxide layer 32 is deposited in the wide trenches, resulting in a combination BOX/LOCOS process structure. In other words, where the active regions are near each other, they are separated by a narrow trench isolation region which is formed using the BOX process while, where the active regions are relatively far from each other, they are separated using a combination of the BOX and the LOCOS processes.

Apparently, this method for making isolation region structures of semiconductor devices with a combination of LOCOS and BOX techniques not only satisfies all requisites for high integration of a semiconductor device (such requisites being a planar surface with no bird's beak and so on) but also is much simpler in that only a single photolithographic masking step is required.

However, the above-stated isolation method is somewhat cumbersome because, when the trenches 20a–20d are filled with the oxide layer, complicated steps must be carried out. More specifically, the conventional combination method comprises: (1) oxidizing a substrate to form a thermal oxide layer in trenches; (2) CVD depositing oxide in the trenches and applying etch back to the oxide to form sidewalls in the trenches; (3) carrying out a field oxidation process to form a field oxide layer in a wide trench; and (4) depositing another CVD oxide layer and etching back this, so as to fill up both narrow trenches with the CVD oxide layer and to fill the wide trenches with the CVD oxide and field oxide. The conventional isolation method, therefore, is not able to achieve isolation regions with a homogeneous structure, and results in higher production costs due to its many steps.

OBJECTS OF THE INVENTION

One object of the invention to solve the problems of bird's beak and the encroachment of channels on dopants on the active region when applying LOCOS isolation techniques.

Another object of the invention to solve the problem of low punch through voltage attributed to short channel of a parasitic field transistor when making a semiconductor device.

A further object of the invention to solve the problems of nonuniform etch back and filling of the CVD oxide layer attributed to the change of the active region when applying a BOX isolation technique.

Yet another object of the invention to provide an isolation region structure without encroachment of the active region.

A final object of the invention is to provide a method for making an isolation region structure having lower production cost.

SUMMARY OF THE INVENTION

In accordance with a first aspect of the invention, there is provided a method of making a semiconductor device comprising the steps of: forming a first field layer on a field region of a substrate; etching the first field layer so peripheral portions of the first field layer are removed and so that a center portion of the first field layer remains; etching the exposed surface of the substrate to form a trench at the peripheral portions of the first field layer; (d) forming an oxidizable layer over the trench and the first field layer surrounded by the trench; and, oxidizing the oxidizable layer to form a second field layer.

In accordance with a second aspect of the invention, there is provided a method for the making a semiconductor device comprising the steps of: forming a first layer and then a second layer on a substrate; removing the second layer in a first field region and in a second field region which is wider than the first field region; applying a first oxidation process to the first and second field regions to thereby form first field layers, each of which has a thickness depending on the width of the respective field region; etching the first field layers so that the first field layer in the first field region is removed and so that peripheral portions of the first field layer in the second field region are removed, thereby leaving a center region in the second field region; etching the exposed surfaces of the substrate so as to form a trench in the first field region and a trench at the peripheral portions of the second field region; forming an oxidizable layer in the trench of the first field region and in the trench of the second field region; and, performing a second field oxidation process to form a second field layer in the first and second field regions.

In accordance with a third aspect of the invention, there is a semiconductor device comprising: a Substrate having a first field region and a second field region which is wider than the first field region; a trench in the first field region; a trench at the periphery of the second field region; an insulating layer on the trenches of the first and second field regions; an oxidizable layer in each of the trenches and on the insulating layer; and, a field layer over the oxidizable layer of the trenches.

In accordance with a fourth aspect of the invention, there is provided a semiconductor device comprising: a substrate having a first field region and a second field region which is wider than the first field region; a trench in the first field region; a trench at the periphery of the second field region; an insulating layer on the trench of the first field region and on the trench of the second field region; an oxidizable layer in the trench of the second field region; and, a field layer over the first field region and the second field region.

BRIEF DESCRIPTION OF THE DRAWINGS

The above objects and other advantages of the invention will become more apparent by describing in detail the preferred embodiment of the invention with reference to the attached drawings in which.

DETAILED DESCRIPTION OF THE INVENTION

Figure 1A:
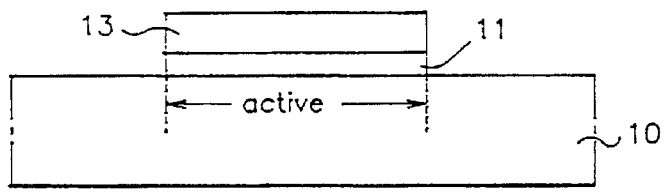
FIG. 1A and 1B are prior art schematic cross sectional views showing a general LOCOS process for an isolation region structure.
Figure 1B:
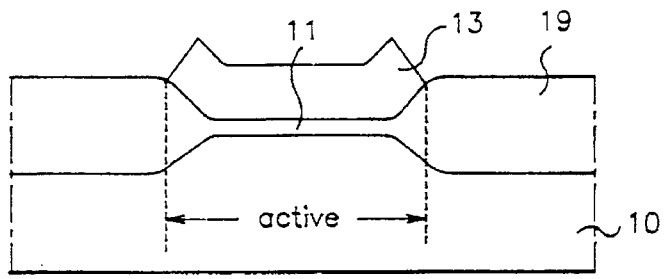
Figure 2:
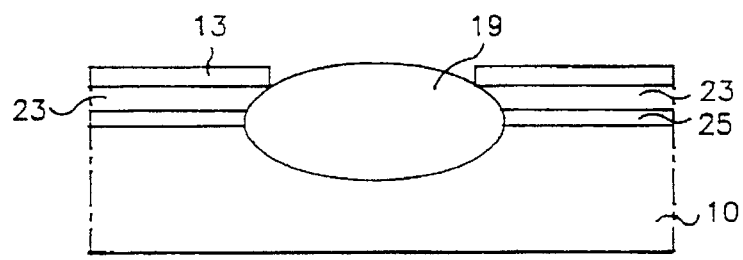
FIG. 2 is a prior art schematic cross sectional view showing a general isolation region structure made by a general LOCOS process using a polysilicon layer as a stress buffer.
Figure 3:
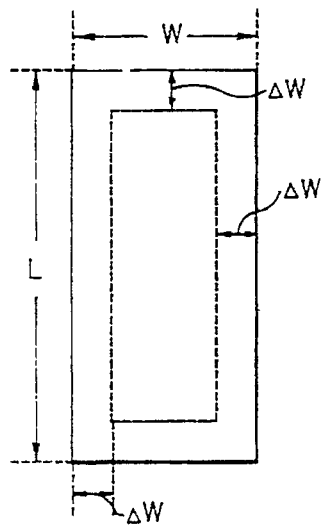
FIG. 3 is a prior art schematic view showing the amount of the encroachment of channel stop dopants on the active region.
Figure 4A:
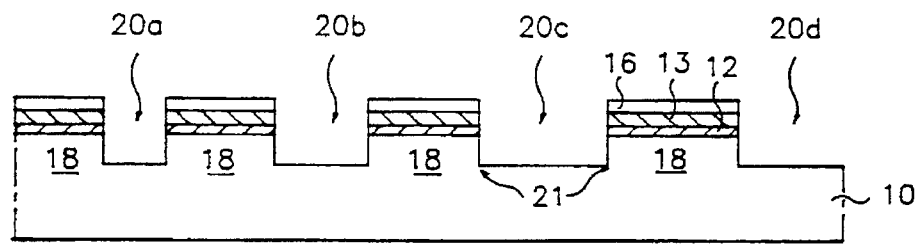
FIGS. 4A through 4H are schematic cross sectional views showing a prior art method for making an isolation region structure employing a combination LOCOS process and a BOX process.
Figure 4B:
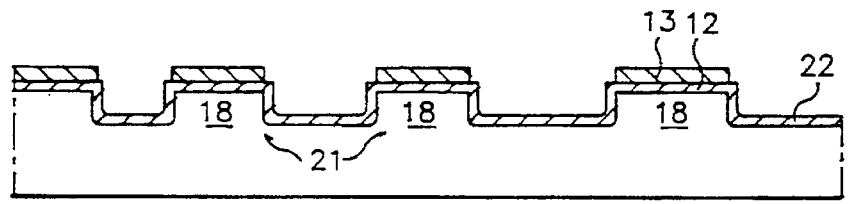
Figure 4C:
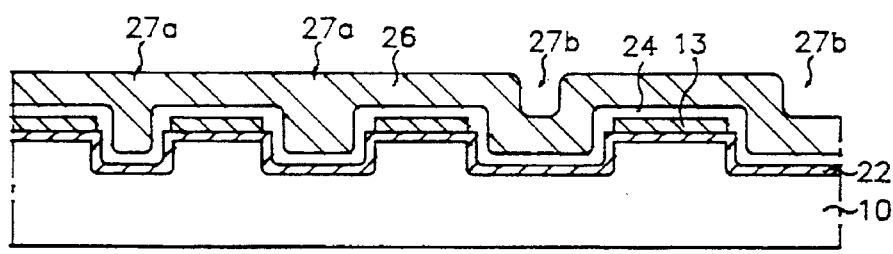
Figure 4D:
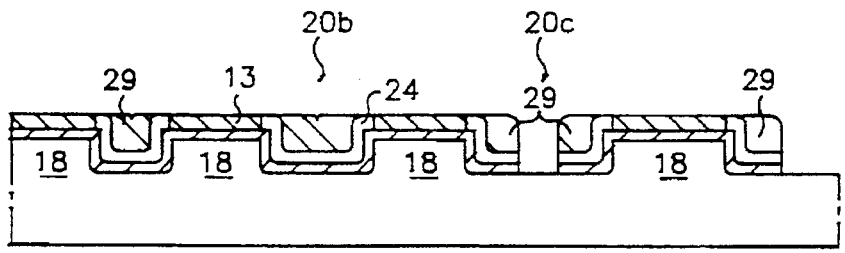
Figure 4E:
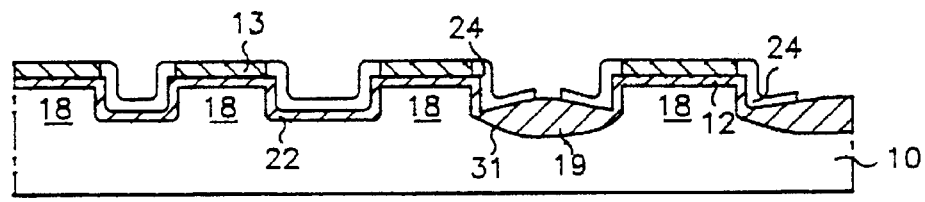
Figure 4F:
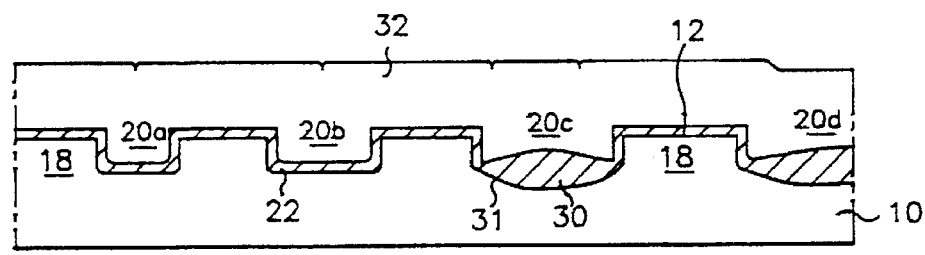
Figure 4G:
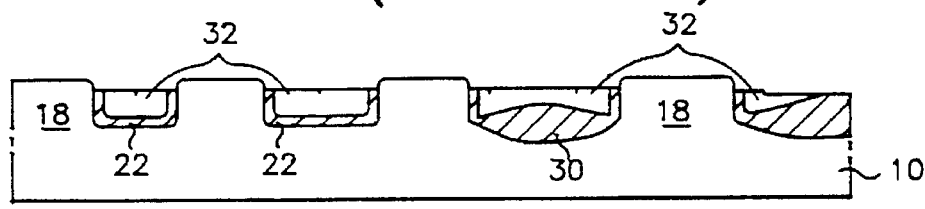
Figure 4H:
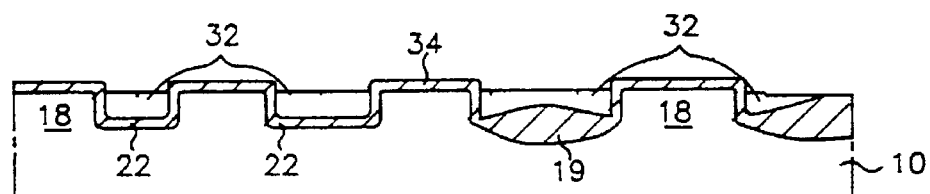

Hereinafter, the preferred embodiments of the invention will be described with reference to the accompanying drawings, wherein like reference numerals designate like parts, respectively.

Figure 5:
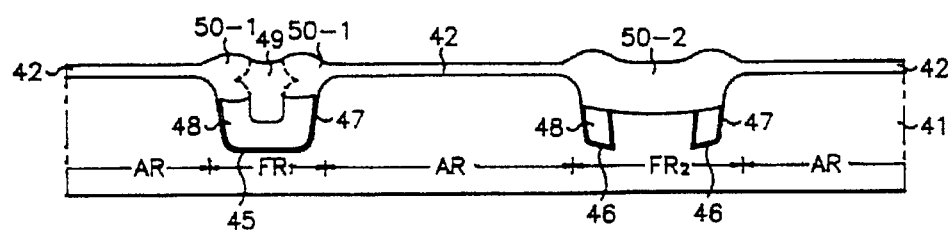
FIG. 5 is a schematic cross-sectional view showing an isolation region structure according to a first embodiment of the invention.

Referring initially to FIG. 5, there is illustrated a cross-sectional view of a semiconductor device in which isolation regions are formed according to a first embodiment of the invention.

The semiconductor device according to the first embodiment has a substrate 41 comprising a plurality of active regions (A/t) each of which is defined between two adjacent field regions (FR) with a respective width. In a relatively narrow field region ($FR_1$), a trench 45 is formed. In contrast, a relatively wide field region ($FR_2$) has a trench 46 (in cross section appearing as two trenches) at the periphery of the wide field region. A thin oxide layer 47 is formed on the trenches. Another thin oxide layer 42 is formed on the substrate of the active regions. The trench 45 is filled up with insulating materials. The sidewall and the bottom of the trench 45 are formed with a polysilicon layer 48. On the other hand, the center part of the polysilicon layer 48 is filled with an insulating layer 49, such as a CVD oxide layer or a CVD nitride layer, and both sides of the trench 45 are covered with a field oxide layer 50-1. The lower part of the trench 46 is filled with a polysilicon layer 48 and the upper part of the trench 46, as well as the wide field region surrounded by the trench 46 is covered with a thick field oxide layer 50-2.

Referring to FIGS. 6A through 6K, there is illustrated a method for the making of an isolation region in a semiconductor device according to the first embodiment of the invention.

Figure 6A:
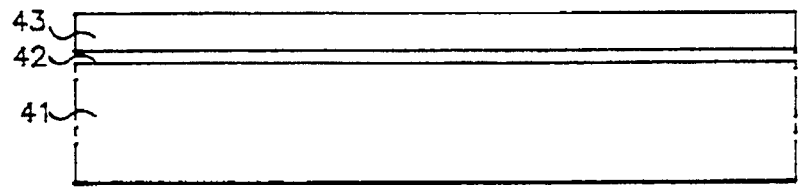
FIG. 6A through 6K are schematic cross-sectional views showing a method for making the isolation region structure according the first embodiment of the invention.

First, over a substrate 41 (formed, for example, of silicon) a thermal oxide layer 42 is grown as shown in FIG. 6A to a thickness of about 130 Angstroms at about 850 °C. under a mixture of $H_2$ and $O_2$. A nitride layer 43 is deposited on the thermal oxide layer 42 in a thickness of 1,400 Angstroms using a low pressure chemical vapor deposition (LPCVD) process at 780 °C.

Figure 6B:
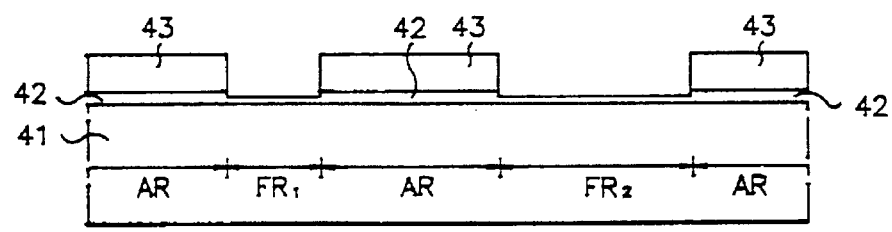

FIG. 6B is a cross-sectional view of the semiconductor device after a photo-etching process has been carried out to define active regions (AR) and field regions ($FR_1$,$FR_2$) and after the nitride layer 43 has been removed from the field regions using a reactive ion etching (hereinafter RIE) process. The etching chemistry preferably used is $OF_4/CFH_3$.

Figure 6C:
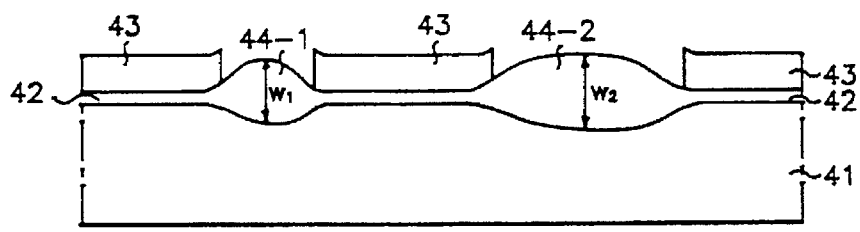
Figure 6D:
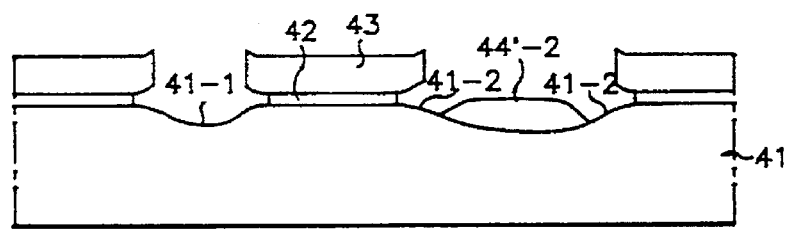

FIG. 6C is a cross-sectional view of the semiconductor device after an oxide layer 42 has been grown at about 1,000 °C. under a mixture of $H_2$ and $O_2$. At this point, in a narrow field region ($FR_1$) having a width of not more than 0.5 μm, there is formed a relatively thin field oxide layer 44-1. In contrast, in a wide field region ($F_2$) having a width of not less than 1.0 μm, there is formed a relatively thick field oxide layer 44-2.

In practice, the field oxide layer is grown to a thickness of about 1,800 Angstroms in a field region having a width of 0.5 μm or less, whereas it is grown to a thickness of about 2,500 Angstroms in a field region having a width of 1.0 μm or more.

The reason for forming the thin oxide layer in the narrow field region is that the stress generated by the volume expansion during field oxidation is easily released in the wide field region but not in the narrow field region. The phenomenon wherein the field oxide layer which is formed becomes thinner as the distance of the active region is made narrow is known as "oxide thinning".

Figure 12A:
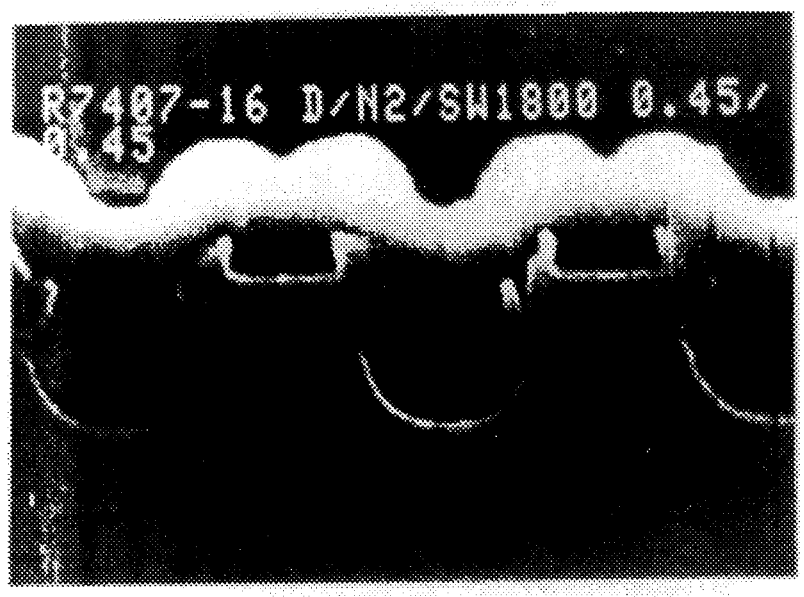
FIGS. 12A and 12B are photographs taken by a scanning electron microscope showing the field oxide thicknesses with regard to the distance between active regions.
Figure 12B:
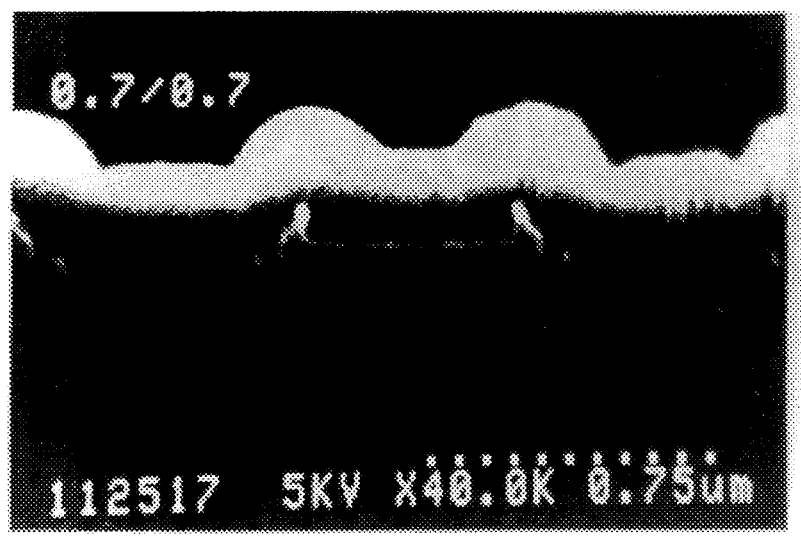

FIGS. 12A and 12B are photographs taken by a scanning electron microscope (SEM) showing the field oxide thicknesses according to the distances between active regions. The field oxide thicknesses were formed by field oxidation at 1,000° C. FIG. 12A shows a field oxide layer formed in a relatively narrow field region. In contrast, FIG. 12B shows the field oxide layer formed in a relatively wide field region. From the photographs, it is apparent that the narrower the distance between the active regions, the thinner the field oxide layer.

Figure 13:
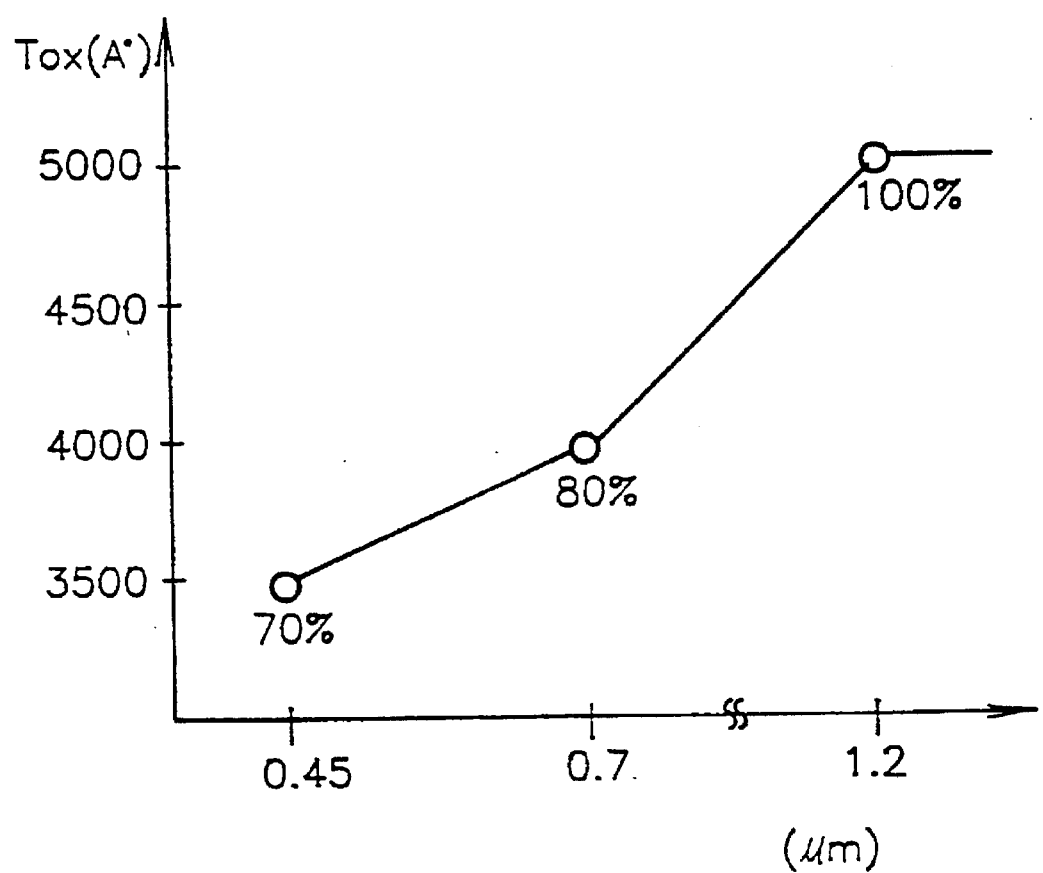
FIG. 13 is a graph showing the relation of the field oxide thickness with the distance between the active regions.

Referring now to FIG. 13, the field oxide thickness measured is plotted with regard to the distance between the active regions. As seen in this figure, the field oxide layer is formed in a thickness of 5,000 Angstroms when the distance between the active regions is 1.2 μm. On the other hand, the field oxide layer is 3,500 Angstroms thick when the distance is 0.45 m. Therefore, it is confirmed by the measured values that a narrow distance between the active regions results in the field oxide layer being thin as compared with when the distance between active regions is wide.

Returning to FIG. 6D, there is illustrated a cross-sectional view of the semiconductor device after the field oxide layer has been made thinner by dipping it in a buffer oxide etchant (BOE). The resulting thickness is about 500 Angstroms. All the field oxide layer formed in the relatively narrow field region $FR_1$, that is, the relatively thin field oxide layer 44-1, is removed, so as to expose the silicon substrate therein. The field oxide layer formed in the relatively wide field region $FR_2$, that is, the relatively thick field oxide layer 44-2, is removed in part, so as to partially expose the substrate therein. In the relatively narrow field region ($FR_1$) a self-aligned trench is later formed. Also, in the relatively wide field region ($FR_2$) a self-aligned trench is later formed at the periphery thereof.

Figure 6E:
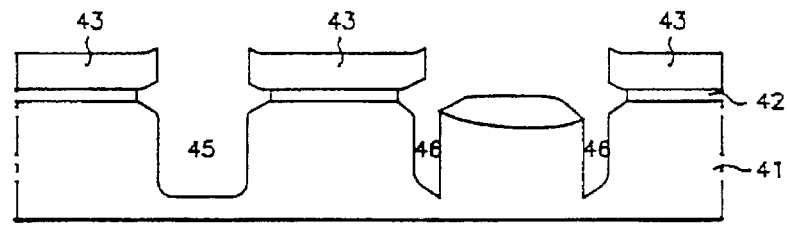

Next, utilizing the nitride layer 43 which remains over the active regions as a mask, the exposed silicon substrate 41 is etched with a RIE process, as shown in FIG. 6E. The etching chemistry preferably used is $HBr/Cl_2$. In the narrow field region $FR_1$, the exposed area of the substrate is etched so as to form a trench 45. In the wide field region $FR_2$, the substrate exposed at the periphery of the remaining field oxide layer 44'-2 is etched, so as to form a trench 46. The etch depth in the trench 45 and the trench 46 should be chosen to provide sufficient insulating characteristics according to the degree of integration of the semiconductor device. In one embodiment of the invention, the etch depth is 4,000 Angstroms. With the etch of the field oxide layer 44-1, the corners of the trench 45 are rounded off, which is advantageous in forming a slope of the trench 45.

Figure 6F:
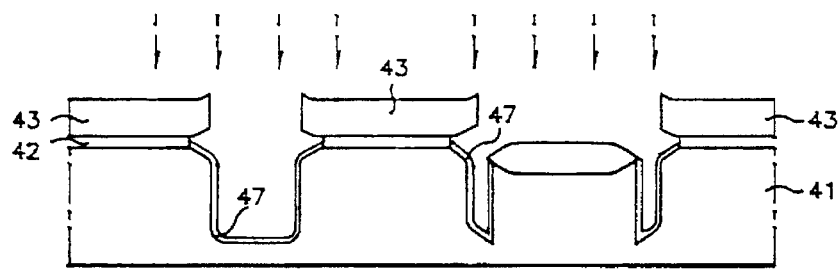

Subsequently, the areas of the substrate exposed by the formation of the trenches 45,46 are subjected to thermal oxidation at about 850 ° C. under a mixture of $H_2$ and $O_2$, so as to grow a thin oxide layer 47 to a thickness of about 130 Angstroms, as shown in FIG. 6F. Then, channel stop dopants are implanted as indicated by the arrows. In the case of an N-type MOSFET region, boron ions are implanted. On the other hand, where a P-type MOSFET region is formed, phosphorous ions are implanted.

Figure 6G:
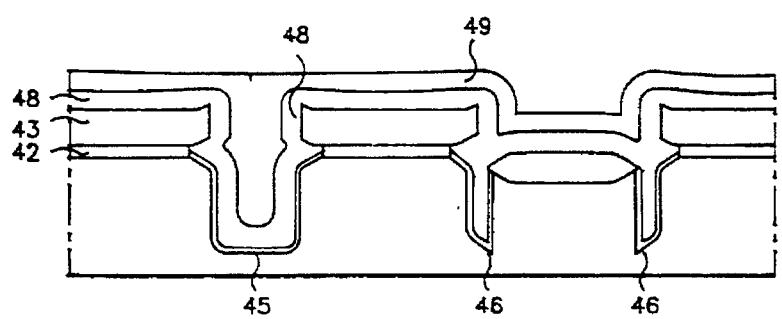

FIG. 6G is a cross-sectional view of the semiconductor device after an undoped polysilicon layer 48 (which may optionally be an amorphous polysilicon layer) has been deposited entirely over the thus-far formed device by a low pressure chemical vapor deposition process to a thickness of about 1,500 Angsttoms, followed by the deposition of an insulating layer 49 (formed, for example, of a high temperature oxide (HTO) layer) having a thickness of about 2,000 Angstroms using a CVD process. Instead of the oxide layer, a nitride layer may be used. The trench formed in the narrow field regions $FR_1$ is filled with the insulating layer 49. In contrast, the wide field region $FR_2$ has a depression instead of a planar top surface.

Figure 6H:
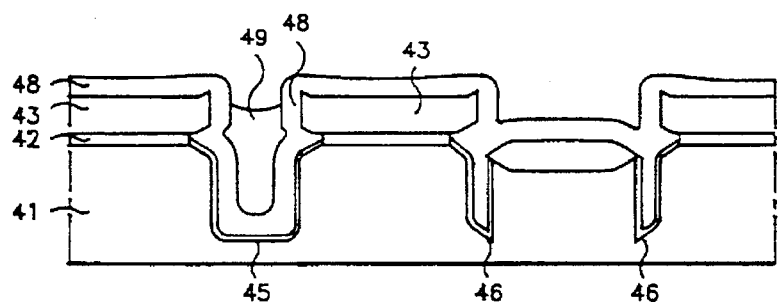

An anisotropic plasma etch is applied to the insulating layer 49 so as to leave the insulating layer 49 only within the trench 45, as shown in FIG. 6H. As a result, all of the polysilicon layer 48 but within the trench 45 is exposed.

Figure 6I:
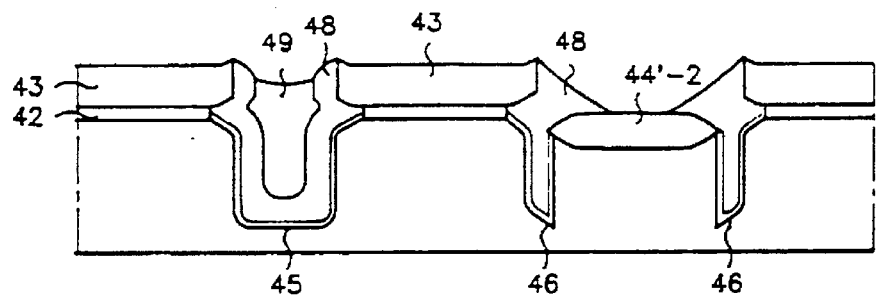

FIG. 6I is a cross-sectional view of the semiconductor device after the exposed polysilicon layer 48 has been subjected to anisotropic plasma etch until the nitride layer 43 is exposed. As a result, the polysilicon layer 48 is left only within the trench 45 and the trench 46.

Figure 6J:
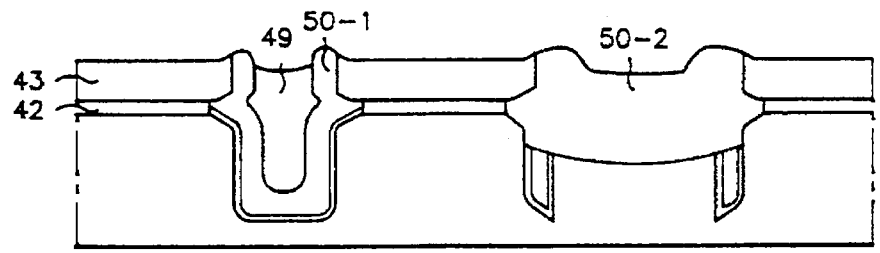

A second field oxidation is performed at about 1,000° C. under a mixture of $H_2$ and $O_2$, to grow a field oxide layer 50-1, 50-2 having a thickness of about 2,500 Angstroms, as shown in FIG. 6J. At this point, it should be noted that the insulating layer 49 buried in the trench 45 serves as a stress buffer layer when performing the second field oxidation process.

Figure 6K:
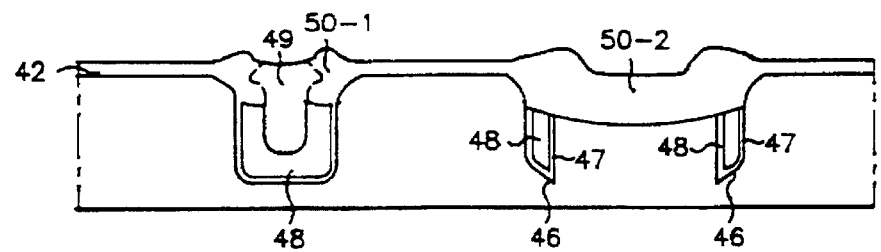

Finally, the nitride layer 43, the mask for oxidation, is removed by dipping it in hot phosphoric acid, as shown in FIG. 6K. In the narrow field region $FR_1$, the trench 45 is filled with the undoped polysilicon layer 48 and the high temperature oxide layer 49 and the top of layer 48 is covered with a field oxide layer 50-1, so as to form an isolation region, whereas, in the wide field region $FR_2$, the trench 46 is filled with the polysilicon layer 48 and this layer is covered with a field oxide layer 50-2, so as to form another isolation region.

Figure 7A:
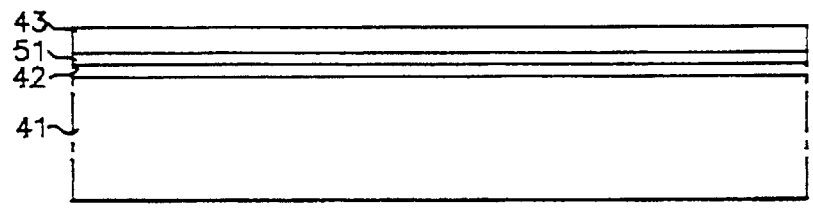
FIG. 7A through 7K are schematic cross-sectional views showing another method for making the isolation region structure according the first embodiment of the invention.

Referring now to FIGS. 7A through 7K, there is illustrated another method for the making of an isolation region in a semiconductor device according to the first embodiment of the invention. This method is similar to that of FIGS. 6A through 6K, except that, as a stress buffer layer, an undoped polysilicon layer 51 is used between thin oxide layer 42 and nitride layer First, over a substrate 41 a thin oxide layer 42 is grown to a thickness of about 130 Angsttoms at about 850° C. under a mixture of $H_2$ and $O_2$, as shown in FIG. 7A. Over this, there are sequentially deposited an undoped polysilicon layer S1 with a thickness of about 500 Angstroms and a nitride layer 43 with a thickness of 1,400 Angstroms by an LPCVD process. The polysilicon layer 51 has many purposes, one of which is to serve as a stress buffer layer.

Figure 7B:
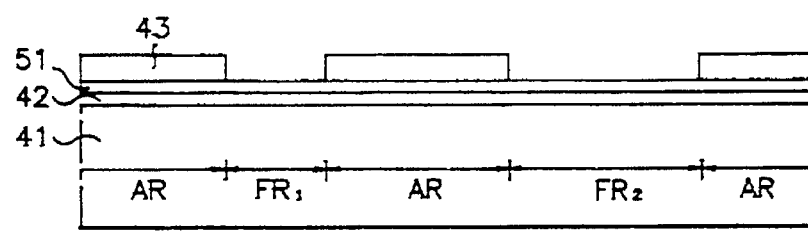

FIG. 7B is a cross-sectional view of the semiconductor device after a photo-etching process has been carried out to define active regions (AR) and field regions ($FR_1$, $FR_2$) and after the nitride layer 43 has been removed from the field regions by a RIE process using $OF_4/CHF_3$ chemistry. As a result, the polysilicon layer of the field regions is exposed. A plurality of active regions (AR) are defined, which are separated from one another different distances.

Figure 7C:
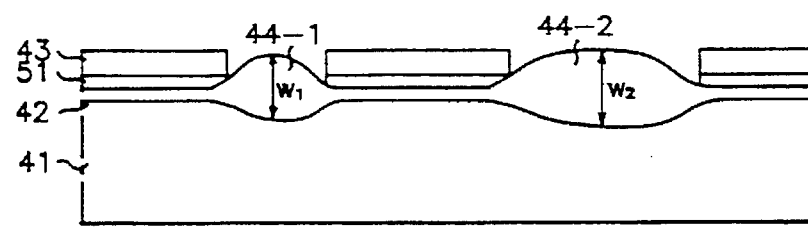

FIG. 7C is a cross-sectional view of the semiconductor device after a field oxide layer 44-1, 44-2 has been grown by a primary field oxidation process at about 1,000° C. under a mixture of $H_2$ and $O_2$. At this point, in a narrow field region ($FR_1$) with a width of not more than 0.5 µm, there is formed a relatively thin field oxide layer 44-1. In contrast, in a wide field region ($FR_2$) having a width of not less than 1.0 µm, there is formed a relatively thick field oxide layer 44-2. In practice, the field oxide layer is grown to a thickness of about 1,800 Angsttoms in the field region of 0.5 m width or less, whereas it is grown to a thickness of about 2,500 Angstroms in the field region having a width of 1.0 uµ or more.

Figure 7D:
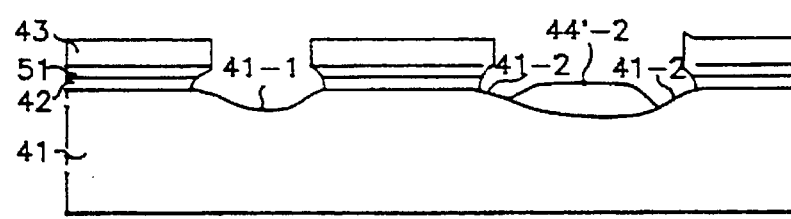

FIG. 7D is a cross-sectional view of the semiconductor device after the relatively thin field oxide layer 44-1 has been removed so as to expose the silicon substrate thereunder and the relatively thick field oxide layer 44-2 has been made thinner by dipping it in a buffer oxide etchant (BOE). The resulting thickness of field oxide layer 44'-2 is about 500 Angsttoms. After the etch, there is left the field oxide layer 44'-2 in the center area of relatively wide field region $FR_2$, and the substrate is exposed surrounding this area, as illustrated by reference numerals 41-1, 41-2.

Figure 7E:
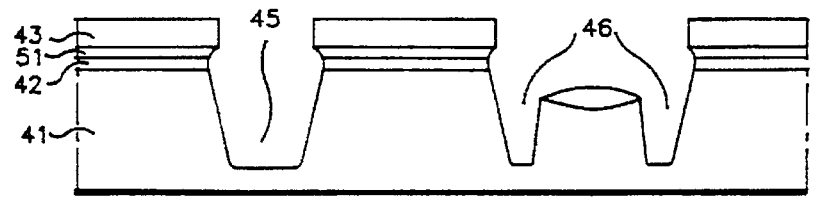

Next, utilizing the remaining nitride layer 43 as a mask, the exposed areas of the substrate 41 are etched with an RIE process, as shown in FIG. 7E. In the narrow field region $FR_1$, the exposed area of the substrate is etched to form a trench 45. In the wide field region $FR_2$, the substrate exposed surrounding the remaining field oxide layer 44'-2 is etched with the oxide layer 44'-2 as a mask, so as to form a trench 46 at these portions. The etching chemistry preferably used is $HBr/Cl_2$, and the etch depth in the trench 45 and the trench 46 is 4,000 Angstroms.

Figure 7F:
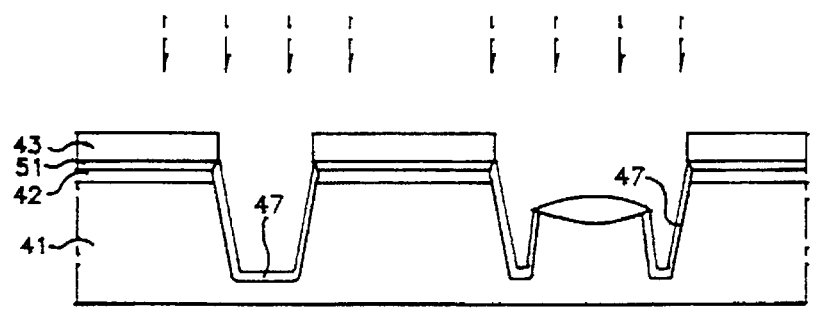

Subsequently, a thermal oxide layer 47 having a thickness of about 130 Angstroms is grown within the trench 45 and the trench 46 by thermal oxidation at about 850° C. under a mixture of $H_2$ and $O_2$ ambient, as shown in FIG. 7F and then, channel stop dopants are implanted as indicated by the arrows.

Figure 7G:
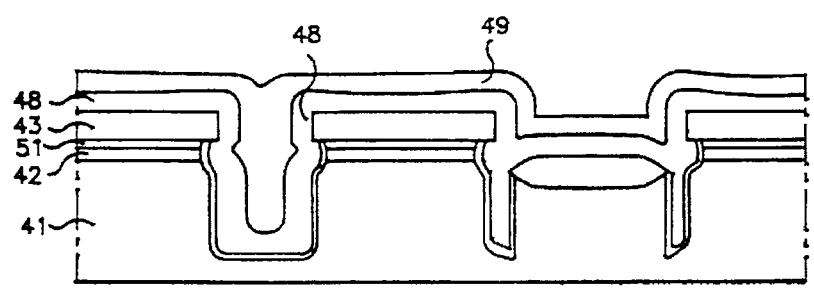

FIG. 7G is cross-sectional view of the semiconductor device after an undoped polysilicon layer 48 has been deposited entirely over the thus-far formed device by an LPCVD process to a thickness of about 1,500 Angstroms, followed by the deposition of an insulating layer 49 having a thickness of about 2,000 Angstroms using a CID process. As the insulating layer either an oxide layer or a nitride layer may be used.

Figure 7H:
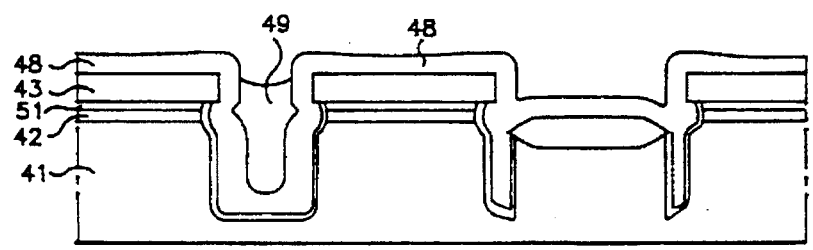

An anisotropic plasma etch is applied to the insulating layer 49, so as to leave it only within the trench 45, as shown in FIG. 7H. As a result, all the polysilicon layer 48 but within the trench is exposed.

Figure 7I:
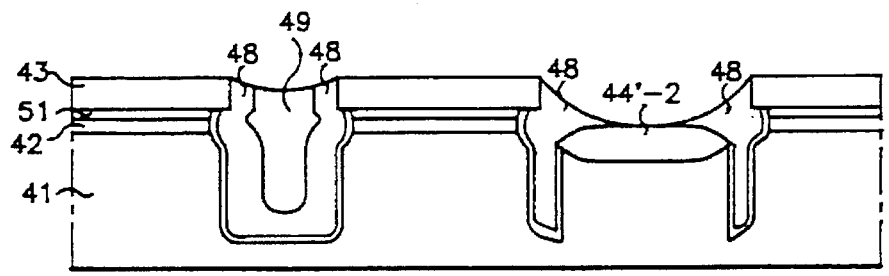

FIG. 7I is a cross-sectional view of the semiconductor device after the exposed polysilicon layer 48 has been subjected to anisotropic plasma etch until the nitride layer 43 is exposed.

Figure 7J:
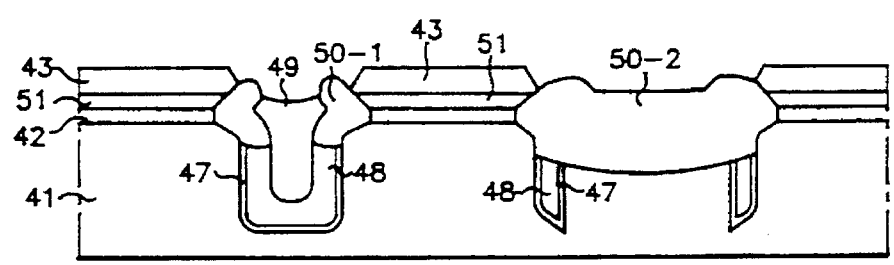

A secondary field oxidation process is performed at about 1,000° C. under a mixture of $H_2$ and $O_2$, to grow a field oxide layer 50-1,50-2, with the layer 50-2 having a thickness of about 2,500 Angstroms, as shown in FIG. 7J.

Figure 7K:
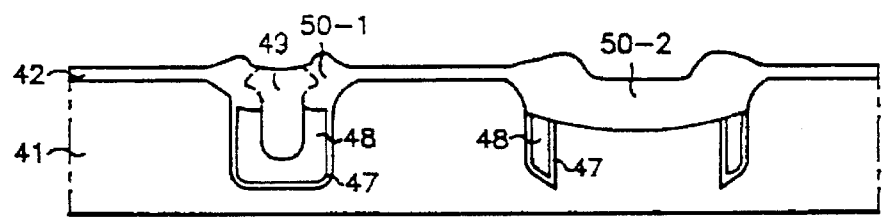

Finally, the nitride mask 43 for oxidation and the polysilicon stress buffer layer 51 are removed, to complete the formation of isolation regions, as shown in FIG. 7k.

It should be noted that, since the undoped polysilicon 51 between the nitride layer 43 and the thermal oxide layer 42 is oxidized during the field oxidation of FIG. 7C, the amount of the lateral etch through the thermal oxide layer 42 between the substrate 41 and the nitride layer 43 can be minimized during a subsequent step of partially removing the field oxide layer.

Figure 8:
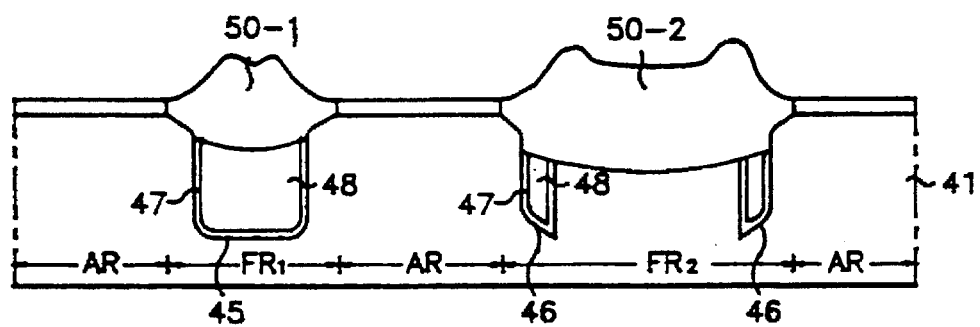
FIG. 8 is a schematic cross-sectional view showing an isolation region structure according to a second embodiment of the invention.

Referring to FIG. 8, there is a cross-sectional view of a semiconductor device in which isolation regions are made according to a second embodiment of the invention.

The semiconductor device according to the second embodiment has a substrate 41 comprising a plurality of active regions (AR) each of which is defined between field regions ($FR_1$ $FR_2$) of different widths. In a relatively narrow field region ($FR_1$), a trench 45 is formed. The trench 45 is coated with a thin oxide layer 47 and filled with an undoped polysilicon layer 48 the top of which is covered with a field oxide layer 50-1. In contrast, a relatively wide field region ($F_2$), as in the first embodiment, has a peripheral trench 46 which is coated with the thin oxide layer 47 and filled with the undoped polysilicon layer 48. In addition, the trench 46 and the substrate surrounded by the trench are covered with a field oxide layer 50-2.

Referring to FIGS. 9A through 9J, there is illustrated a method for making an isolation region in a semiconductor device according to the second embodiment of the invention.

The processes illustrated in FIGS. 9A through 9F according to the second embodiment of the invention proceed in the same manner as those illustrated in FIGS. 6A through 6F according to the first embodiment.

Figure 9A:
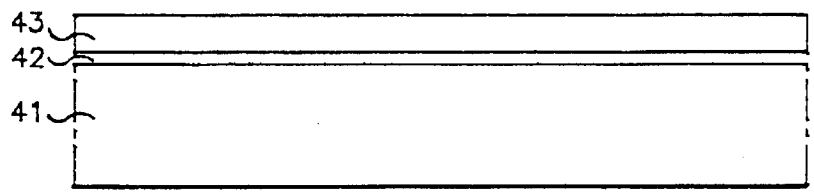
FIG. 9A through 9J are schematic cross-sectional views showing a method for making the isolation region structure according to the second embodiment of the invention.
Figure 9B:
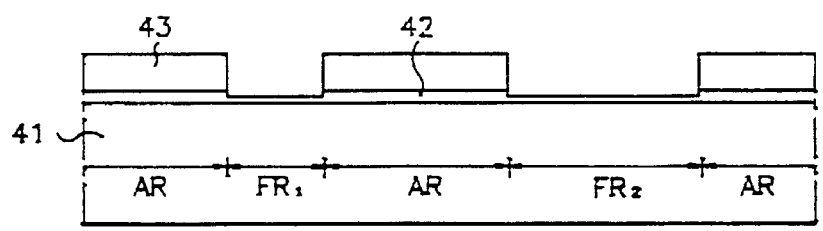
Figure 9C:
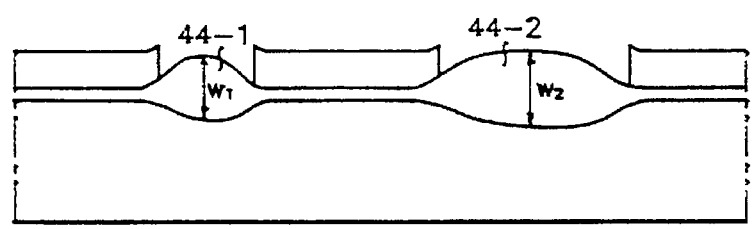
Figure 9D:
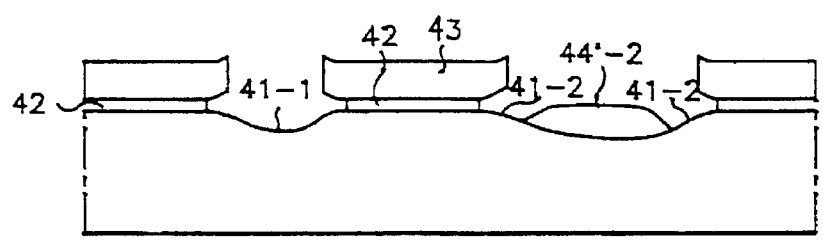
Figure 9E:
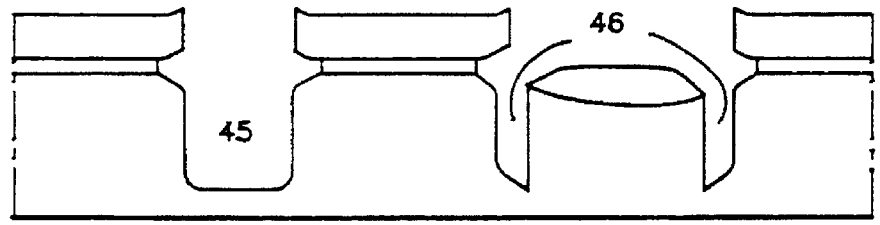
Figure 9F:
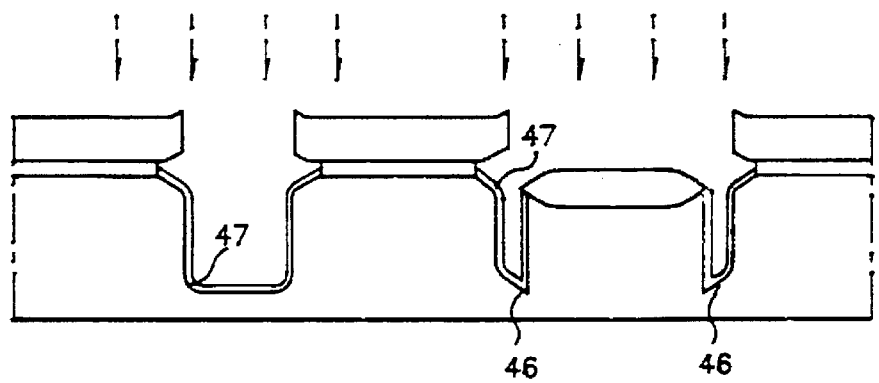
Figure 9G:
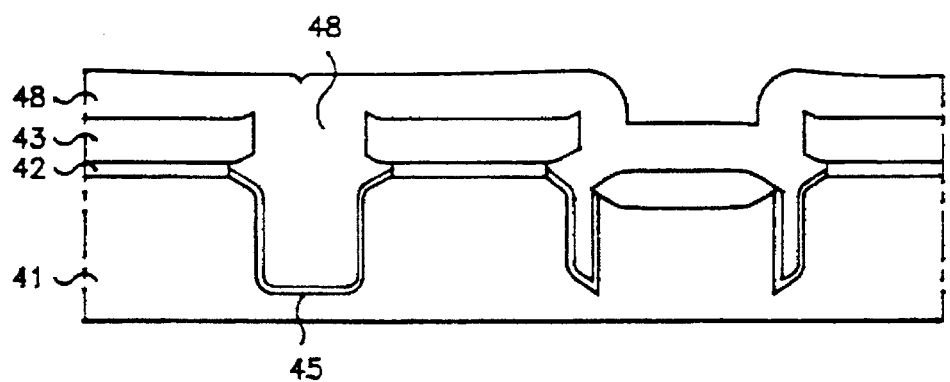

After the growth of the thin oxide layer 47 (FIG. 9F) on both the trenches 45,46 and the ion implantation of the channel stop dopants, the undoped polysilicon layer 48 is deposited entirely over the thus-far formed device using an LPCVD process so as to fill up the trench 45, as shown in FIG. 9G. The thickness of the undoped polysilicon layer 48 should be chosen to be thick enough to planarized its top surface. In the second embodiment of the invention, this thickness is 3,000 Angstroms.

Figure 9H:
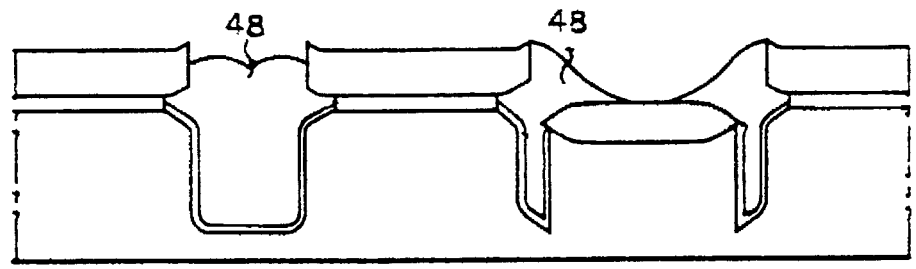
Figure 9I:
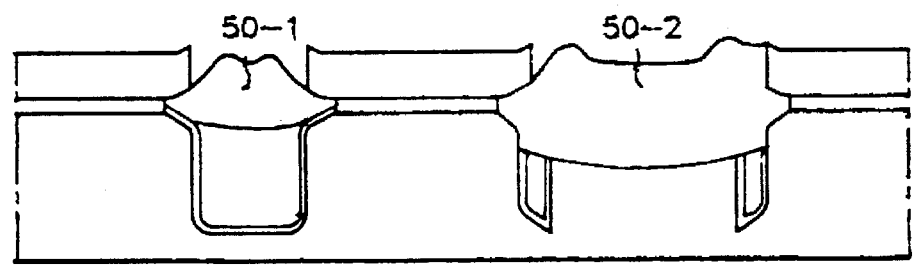
Figure 9J:
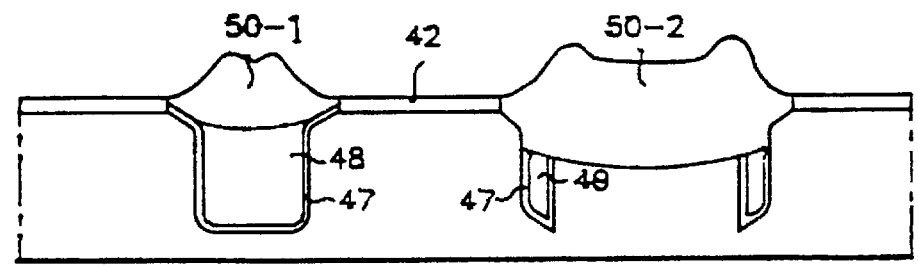

Next, the undoped polysilicon layer 48 is subjected to etch back using an RIE process, so as to expose the nitride layer 43, as shown in FIG. 9H. The etching chemistry preferably used is $HBr/Cl_2$. As a result, the undoped polysilicon layer 48 fills up both the trench 45 and the trench Thereafter, a secondary field oxidation process is carried out under a mixture of $H_2$ and $O_2$, so as to grow field oxide layers 50-1, 50-2, as shown in FIG. 9I. Field oxide layer 50-2 is grown to a thickness of about 2,500 Angstroms. The field oxide layers 50-1, 50-2 cover not only the top of the trench 45 in the narrow field region $FR_1$, but also the trench 46 and the substrate surrounded by the trench 46 in the wide field region $FR_2$.

Figure 10:
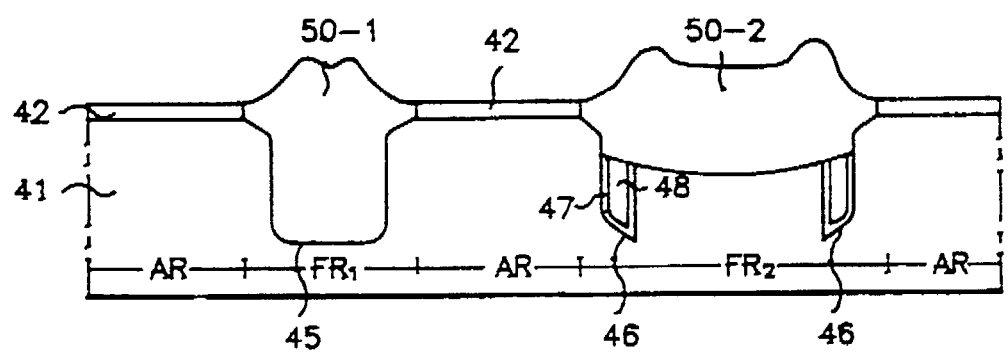
FIG. 10 is a schematic cross-sectional view showing an isolation region structure according to a third embodiment of the invention.

In accordance with the second embodiment of the invention, there is provided an isolation region in the narrow field region which is comprised of the thin oxide layer 47 grown on the sidewall and in the bottom of the trench 45, the undoped polysilicon layer 48 filling the trench 45, and the field oxide layer 50-1 covering the top of the trench In accordance with the second embodiment of the invention, there is also provided an isolation region in the wide field region which is comprised of the thin oxide layer 47 grown on the sidewall and in the bottom of the trench 46, the undoped polysilicon layer filling the trench, and the field oxide layer 50-2 covering the polysilicon layer 48 and the substrate surrounded by the trench Turning now to FIG. 10, there is a cross-sectional view of a semiconductor device in which isolation regions are made according to a third embodiment of the invention.

In accordance with the third embodiment of the invention, the semiconductor device has a substrate 41 comprising a trench 45 in a relatively narrow field region $FR_1$ and trenches 46 in a relatively wide field region $F_2$ which are filled up with a single field layer 50-2 which may, for example, be an oxide layer. In a relatively wide field region $F_2$, an isolation region has the same structure as the first or second embodiment.

Referring to FIGS. 11A through 11J, there is illustrated a method for the making an isolation region in a semiconductor device according to the third embodiment of the invention.

The steps illustrated in FIGS. 11A through 11F according to the third embodiment of the invention proceed in the same manner as those illustrated in FIGS. 6A through 6F according to the first embodiment.

Figure 11A:
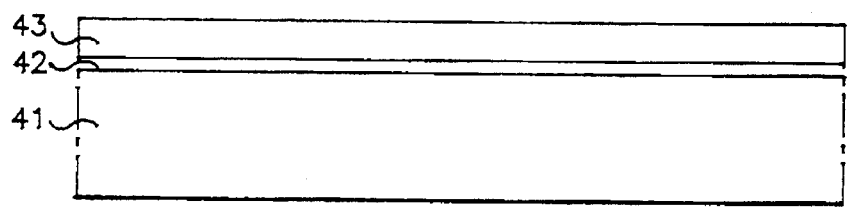
FIG. 11A through 11J are schematic cross-sectional views showing a method for making the isolation region structure according to the third embodiment of the invention.
Figure 11B:
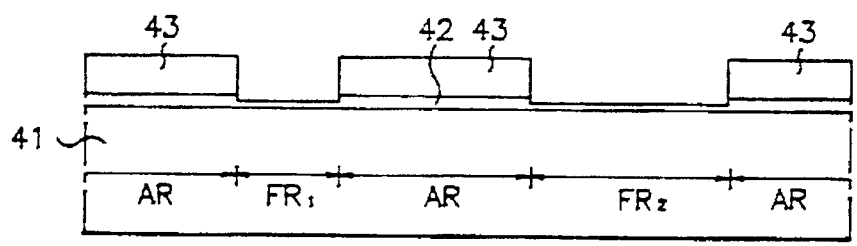
Figure 11C:
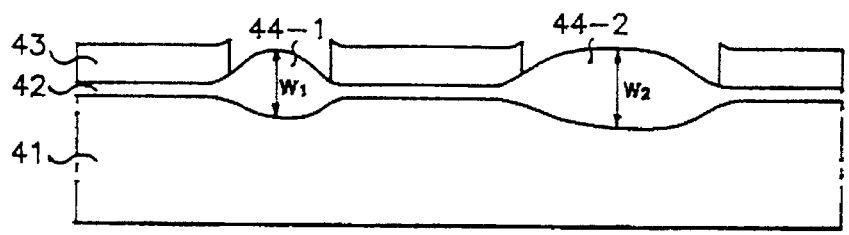
Figure 11D:
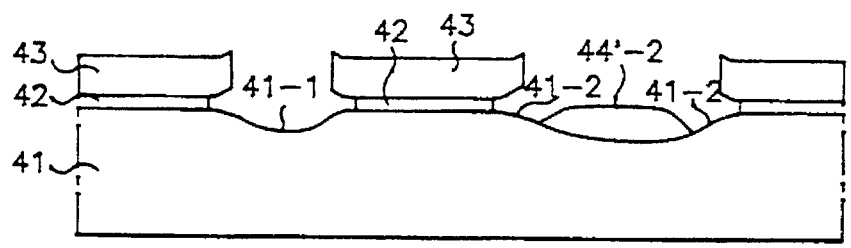
Figure 11E:
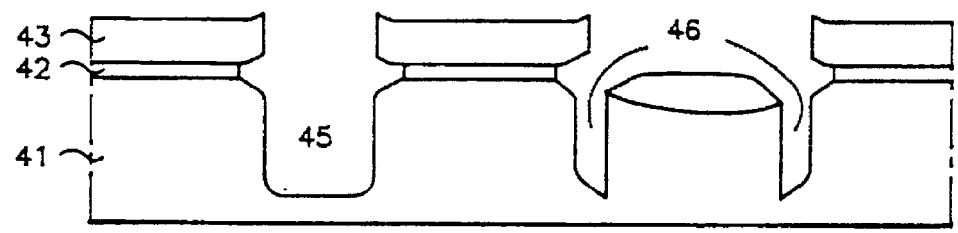
Figure 11F:
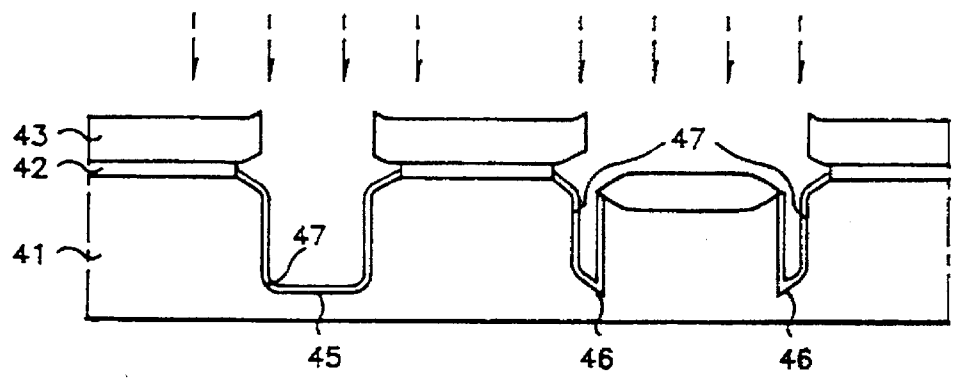
Figure 11G:
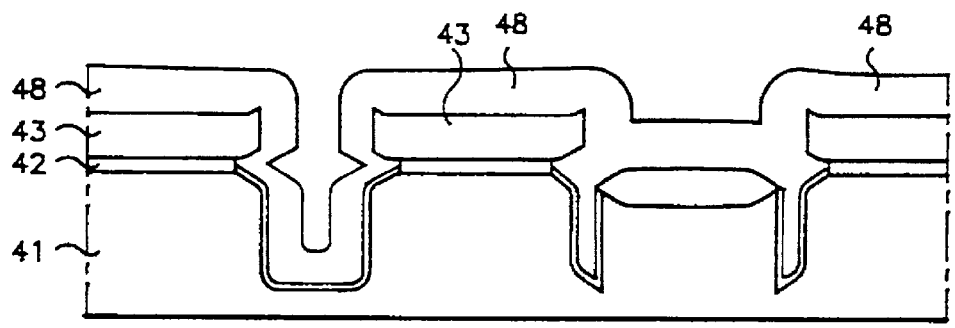

After the growth of a thermal oxide layer 47 (FIG. 11F) on both the trench 45 and trenches 46, and the ion implantation of the channel stop dopants for improving punch-through characteristics, an undoped polysilicon layer 48 is deposited over the thus-far formal device using an LPCVD process, as shown in FIG. 11G. The thickness of the undoped polysilicon layer 48 should be chosen in such a way that the undoped polysilicon layer 48 formed on the opposite sidewalls does not meet and thus deep depressions are formed and left unfilled. However, the thickness of the undoped polysilicon layer 48 should be thick enough to fill up the trenches 46 in the wide field region $FR_2$. In the third embodiment of the invention, this thickness is 2,000 Angstroms.

Figure 11H:
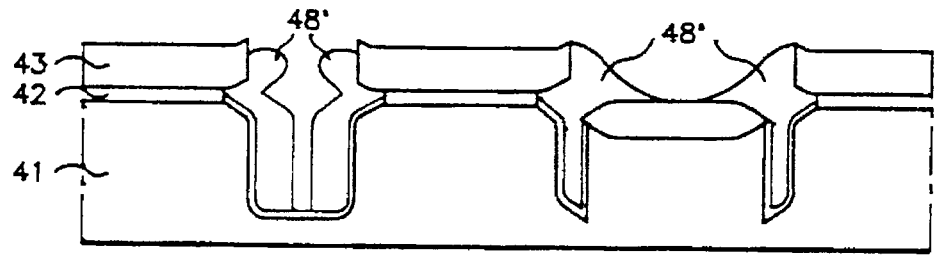

Next, the undoped polysilicon layer 48 is subjected to etch back using an RIE process, to expose the nitride layer 43, as shown in FIG. 11H. At the moment, in the narrow field region $FR_2$, polysilicon sidewalls 48 are formed at both sidewalls of the trench 45, whereas in the wide field region $FR_2$, the undoped polysilicon 48 fills up the trenches.

Figure 11I:
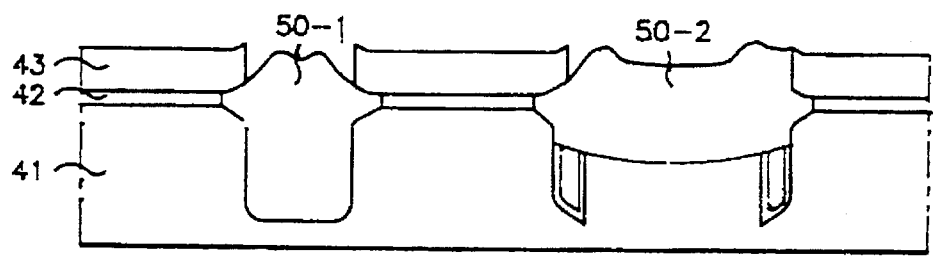
Figure 11J:
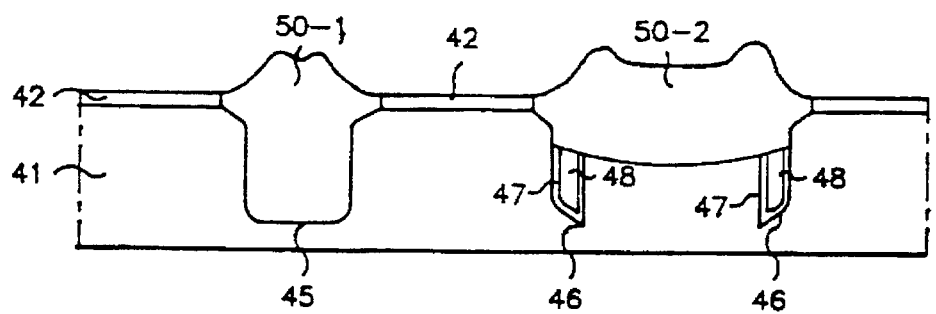

FIG. 11I is a cross-sectional view of the semiconductor device after a secondary field oxidation process has been carried out to grow a field oxide layer 50-1,50-2 in each of the field regions. As a result, in the narrow field region (FR$_1$), the polysilicon sidewalls 48 are grown so as to meet each other and thus the trench 45 is filled up with only a single field oxide layer 50-1. In contrast, the relatively wide field region (FR$_2$) is more complicated. As in the first embodiment, it has a trench 46 (trenches 46, as seen in cross section) which are coated with the thin oxide layer 47 and filled with the undoped polysilicon layer 48. In addition, the trench 46 and the substrate surrounded thereby are covered with a field oxide layer 50-2.

An important feature of the invention is to solve a problem of the conventional trench process known as "loading effect", that is, the filling non-uniformity and non-planar top surface due to the difference in the distances between the active regions. As described above, the field oxide layers have different thicknesses depending to the distance between the active regions and are etched in such a way to partially expose the silicon substrate. The exposed parts of the silicon substrate are etched in self-alignment. Where the distance is short, trenches filled with insulating materials are formed. On the hand, where the distance is long, a peripheral trench is formed and filled with an insulating material, and the trench and the substrate surrounded by it are covered with another material, thereby forming the insulation region structures.

Another important feature of the invention is that the etch of the substrate in self-alignment excludes an anisotropic wet-etch for the formation of the trenches, thus, the method of making the isolation regions according to the invention is much simpler and better than the conventional combination of trench and LOGOS processes.

A further important feature of the invention is to control the profile of the trench so as to be uniformly reproducible and thus to improve the insulation characteristics of the semiconductor device. This feature is achieved by transferring the round profile of the bird's beak and substrate generated during the field oxidation into the trench, instead of by controlling the round profile with the etching condition for the formation of trench.

Yet another important feature of the invention is to improve the punch-through characteristics of semiconductor device. As described above, the reduction of bird's beak by the reduction of the field oxide thickness results in diminishing the encroachment on the active region, and the physical length of the channel of the parasitic field transistor can be extended by filling the groove with undoped polysilicon.

Consequently, the methods for the making the isolation region structures in a semiconductor device according to the invention are very useful to produce a DRAM device with a scale of 64 Mbit or more.

Other features, advantages and embodiments of the invention disclosed herein will be readily apparent to those exercising ordinary skill after reading the foregoing disclosure. In this regard, while specific embodiments of the invention have been described in considerable detail, variations and modifications of these embodiments can be effected without departing from the spirit and scope of the invention as described and claimed.

What is claimed is:

1. A method for making a semiconductor device, comprising the steps of:

(a) forming an insulating layer on a substrate and then a mask layer on the insulating layer;

(b) removing a portion of the mask layer in a first field region and a portion of the mask layer in a second field region, spaced apart from the first region, the removed portion of said mask layer in said first region having a first width, the removed portion of said mask layer in said second field region having a second width greater than said first width, such that an area of the insulating layer exposed in the first field region is narrower than an area of the insulation layer exposed in the second field region;

(c) applying a first oxidation process to the exposed insulating layer in the field regions thereby to form first field oxide layers of differing maximum thickness such that the maximum thickness of the first field layer in the first field region is less than the maximum thickness of the first field layer in the second field region;

(d) etching said first field oxide layers so that the first field oxide layer in the first field region is removed and so that side portions of the first field oxide layer in the second field region are removed while leaving an island of first field oxide layer material in the center of the second field region, said island being recessed into said substrate to form a wide trench;

(e) etching the exposed surface of the substrate so as to form an intermediate-width trench in the first field region and to form at least one peripheral narrow trench-deepening extension of said wide trench corresponding in location to a side portion of the second field region;

(f) forming an oxidizable layer in the trenches of the first and second field regions;

(g) performing a second field oxidation process on the oxidizable layer to form a second field oxide layer in the first and second field regions.

2. The method of claim 1, wherein step (a) includes: forming a polysilicon layer between the insulating layer and the mask layer.

3. The method of claim 1, further comprising the step of forming an insulating layer over the surfaces of the trenches of the first and second field regions after step (e) and before step (f).

4. The method of claim 1, further comprising the step of forming an insulating layer in the trench of the first field region after step (f) and before step (g).

5. The method of claim 1, further comprising the step of implanting channel stop dopants between steps (e) and (f).

6. The method of claim 1, wherein the oxidizable layer of step (f) is an undoped polysilicon layer or an undoped amorphous silicon layer.

7. A method of forming a semiconductor device by concurrently forming both single-trenched small field regions and double-trench-extension large field regions, the method comprising the steps of:

a) forming an insulating layer on a substrate;

b) forming a mask layer on the insulating layer to selectively cover active regions of the semiconductor device such that differently-sized areas of the insulating layer, corresponding to either small field regions or large field regions, are left uncovered by the mask layer, said small field regions having a first width and said large field regions having a second width greater than said first width such that an area of the insulating layer exposed in the small field regions is narrower than an area of the insulating layer exposed in the large field regions;

c) increasing a thickness of the insulating layer in each field region to produce field oxide layers of differing maximum thicknesses such that the maximum thicknesses of the field oxide layers in the small field regions are less than the maximum thicknesses of the field oxide layers in the large field regions;

d) selectively removing an amount of the insulating layer in the field regions sufficient to expose substantially completely the substrate in the small field regions while substantially incompletely exposing the substrate in the large field regions such that islands of insulating layer material remain recessed into the substrate in the centers of the large field regions thereby forming wide trenches, respectively, and such that, in width cross-section, the large field regions have an exposed substrate narrow edge-area bounding both sides of a remaining portion of the first layer;

e) removing the exposed substrate such that intermediate-width trenches are formed in the small field regions and such that two peripheral narrow trench-deepening extensions are formed in the wide trench corresponding in location to the narrow edge-areas;

f) putting conductive material into the trenches such that the trench-deepening extensions of each wide trench are filled and the intermediate-width trenches are at least partially filled; and g) converting a portion of the conductive material into an insulating cap thereby resulting in concurrently-formed disparate field regions of two types, single-trenched small field regions and double-trench-extension large field regions.

8. A method as in claim 7, wherein:

the insulating layer is an oxide layer; and the mask layer is a nitride layer.

9. A method as in claim 7, wherein:

the conductive material of step f) is an oxidizable material.

10. A method as in claim 7, wherein:

the step d) of selectively removing the first layer includes using a buffer oxide etchant.

11. A method as in claim 7, wherein:

the step e) of forming trenches includes reactive ion etching.

12. A method as in claim 7, wherein:

the step f) of putting conductive material into the trenches includes lining the base and walls of each intermediate-width trench with the conductive material thereby leaving an aperture in the trench;

the method further comprising:

h) putting, after the step f) and before the step g), stress-buffering material into the aperture in each intermediate-width trench.

13. A method as in claim 12, wherein:

the stress-buffering material is an insulator.

14. A method as in claim 7, wherein:

the step f) of putting conductive material into the trenches includes fully filling each intermediate-width trench with conductive material.

15. A method as in claim 7, further comprising:

h) forming, after the step a) and before the step b), a stress-buffering layer on the first layer such the stress-buffering layer covers substantially the same areas as the second layer.

16. A method as in claim 7, further comprising:

h) lining, after the step e) and before the step f), the trench-deepening extensions of each wide trench with a thin insulating layer.

17. A method as in claim 16, further comprising:

i) lining, at the same time as step h), each intermediate-width trench with a thin insulating layer.

18. A method as in claim 7, wherein:

the step f) of inputting conductive material into the trenches includes forming the wide trenches such that a trench-deepening extension deepens the wide trench by substantially 60%.

19. A method as in claim 18, wherein:

the step f) of putting conductive material into the trenches includes forming a wide trench to be substantially 2500 Å deep forms each trench-deepening extension to be an additional 1500 Å deep.

20. The method of claim 7, wherein:

at least one of the steps c) and g) uses a thermal oxidation process.

21. The method of claim 7, further comprising the step of:

h) implanting channel stop dopants after the step e and prior to the step f).

22. The method of claim 9, wherein:

the oxidizable material either is undoped polysilicon or undoped amorphous silicon.

* * * * *